United States Patent [19]

Imamura et al.

[11] Patent Number: 4,868,418
[45] Date of Patent: Sep. 19, 1989

[54] COMPARATOR CIRCUIT USING RESONANT-TUNNELING TRANSISTOR

[75] Inventors: Kenichi Imamura, Atsugi; Masao Taguchi, Sagamihara, both of Japan

[73] Assignee: Fujitsu Limited, Kawasaki, Japan

[21] Appl. No.: 151,757

[22] Filed: Feb. 3, 1988

[30] Foreign Application Priority Data

Feb. 14, 1987 [JP] Japan .................. 62-030672

[51] Int. Cl.$^4$ .............................. H03K 5/24
[52] U.S. Cl. .................. 307/362; 307/322; 357/12; 357/16; 357/34; 357/4
[58] Field of Search ............ 307/322, 362, 350, 355; 357/12, 16, 34, 4

[56] References Cited

U.S. PATENT DOCUMENTS

| | | | |
|---|---|---|---|
| 3,176,152 | 3/1965 | Spiegel | 307/322 |
| 3,246,314 | 4/1966 | Kaenel | 307/322 |
| 3,746,948 | 7/1973 | Marek | 307/322 |
| 4,195,240 | 3/1980 | Otofuji | 307/362 |

Primary Examiner—John Zazworsky
Attorney, Agent, or Firm—Armstrong, Nikaido, Marmelstein, Kubovcik & Murray

[57] ABSTRACT

A comparator circuit comprises a differential amplifier supplied with a reference signal and an input signal. A resonant-tunneling transistor has a base supplied with an output signal of the differential amplifier. A collector is connected to a first power supply source via a resistor. An emitter is connected to a second power supply source. Therefore, it is possible to simplify a circuit configuration of the comparator circuit and to improve an operation speed of the comparator circuit by outputting an output signal from a connection portion between the resistor and the collector of the transistor.

10 Claims, 9 Drawing Sheets

COMPARATOR CIRCUIT USING RESONANT-TUNNELING TRANSISTOR

BACKGROUND OF THE INVENTION

1. Field of the Invention

The present invention relates to a comparator circuit, more particularly, to a comparator circuit using a resonant-tunneling transistor (RTT). This resonant-tunneling transistor has a resonant-tunneling barrier for injecting electrons, which includes a resonant-tunneling hot-electron transistor (RHET) and a resonant-tunneling bipolar transistor (RBT).

2. Description of the Related Art

Generally,, a comparator circuit comprises a differential amplifier and a plurality of transistors. The differential amplifier is supplied with an input signal and a reference signal and compares the input signal and the reference signal, and the transistors of the comparator circuit are supplied with a clock signal for outputting a digital signal from an output signal of the differential amplifier. When the input signal is lower than the reference signal, a low level clock signal is output from the comparator circuit, and when the input signal is higher than the reference signal, a high level clock signal is output from the comparator circuit. That is, the change of the output pulse of the conventional comparator circuit can be produced by a small difference in level between the input signal and the reference signal.

However, the conventional comparator circuit has several problems; for example, the conventional comparator circuit needs a plurality of transistors, such as traditional bipolar transistors or field effect transistors, and thus the configuration of the conventional comparator circuit tends to become complex and the operation speed thereof is too slow. Further, the conventional comparator circuit also needs the clock signal for outputting the output pulse from a small difference in level between the input signal and the reference signal, and therefore, the output signal of the conventional comparator circuit is not output until the clock signal has changed. The problems of the conventional comparator circuit will be later explained in detail.

Note, recently a resonant-tunneling transistor having a resonant-tunneling barrier for injecting electrons has been developed. This resonant-tunneling transistor includes a resonant-tunneling hot-electron transistor and a resonant-tunneling bipolar transistor, and has negative differential resistance characteristics and a high speed operation. These resonant-tunneling transistors are shown in U.S. patent application Serial No. b 937,615 and U.S. Pat. No. 4,712,121.

SUMMARY OF THE INVENTION

It is an object of the present invention to provide a comparator circuit which comprises a differential amplifier supplied with a reference signal and an input signal, a resonant-tunneling transistor having a base supplied with an output signal of the differential amplifier, a collector connected to a first power supply via a resistor, and an emitter connected to a second power supply, by which it is possible to simplify a circuit configuration of the comparator circuit and to improve an operation speed of the comparator circuit by outputting an output signal from a connection portion between the resistor and the collector of the transistor.

According to the present invention, there is provided a comparator circuit which comprises a first power supply, a second power supply, a resistor, a differential amplifier, a resonant-tunneling transistor and an output terminal. The resistor is connected to the first power supply. The differential amplifier is supplied with a reference signal and an input signal. The base of the resonant-tunneling transistor is connected to the differential amplifier for receiving an output signal of the differential amplifier, a collector thereof is connected to the first power supply via the resistor, and an emitter thereof is connected to the second power supply. The output terminal is connected to a connection portion between the collector of the transistor and the resistor for outputting an output signal of the comparator circuit.

BRIEF DESCRIPTION OF THE DRAWINGS

The present invention will be more clearly understood from the description of the preferred embodiments as set forth below with reference to the accompanying drawings, wherein:

FIGS. 4a, 4b and 4c are graphs illustrating energy states of the resonant-tunneling hot-electron transistor shown in FIG. 3a;

FIG. 5 is a graph illustrating the characteristics of the resonant-tunneling hot-electron transistor shown in FIG. 3a;

DESCRIPTION OF THE PREFERRED EMBODIMENTS

For a better understanding of the preferred embodiments, the problems of the related art will be first explained.

Figure 1:
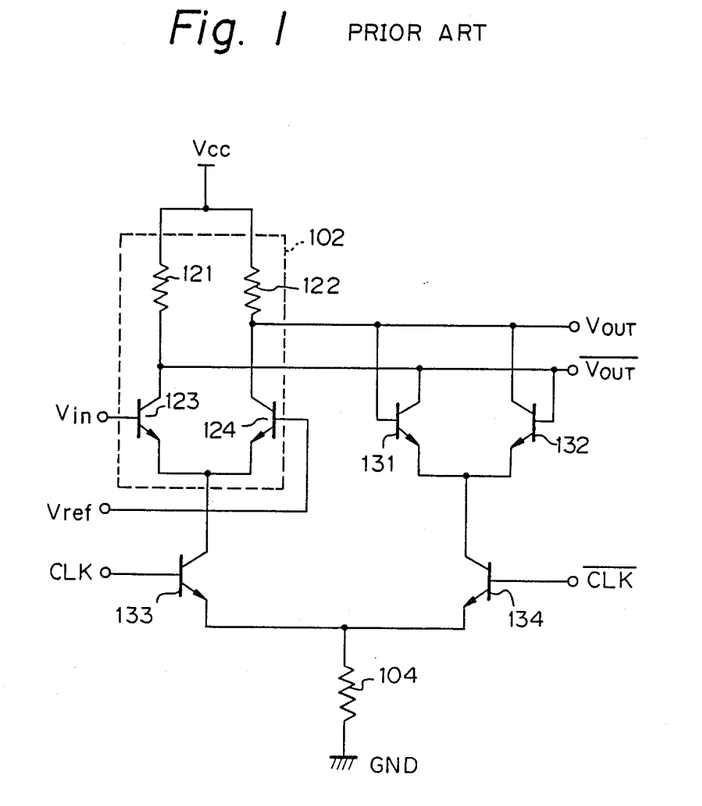
FIG. 1 is a circuit diagram illustrating one example of a conventional comparator circuit.

FIG. 1 is a circuit diagram illustrating one example of a conventional comparator circuit. As shown in FIG. 1, for example, a conventional comparator circuit comprises a differential amplifier 102 and a plurality of transistors 131–134. The differential amplifier 102 includes two resistors 121, 122 and two transistors 123, 124. The collectors of the transistors 123 and 124 are supplied with a high level power supply potential $V_{cc}$ via the resistors 121 and 122 respectively, the emitters of the transistors 123 and 124 are commonly connected to a collector of the transistor 133; the base of the transistor 123 is supplied with an input signal $V_{in}$, and the base of the transistor 124 is supplied with a reference signal $V_{ref}$.

An output signal $V_{OUT}$ is produced from the connection portion between the collector of the transistor 124 and the resistor 122, and an inverted output signal $\overline{V_{OUT}}$ is produced from the connection portion between the collector of the transistor 123 and the resistor 121. The output signal $V_{OUT}$ is applied to the base of the transistor 131 and the collector of the transistor 132, and the inverted output signal $\overline{V_{OUT}}$ is applied to the collector of the transistor 131 and the base of the transistor 132. Further, the emitters of the transistors 131 and 132 are commonly connected to the collector of the transistor 134.

The base of the transistor 133 is supplied with a clock signal CLK, and the base of the transistor 134 is supplied with an inverted clock signal $\overline{CLK}$. The emitters of the transistor 133 and 134 are connected to a low level power supply (for example, an earth GND) via a resistor 104.

Figure 2:
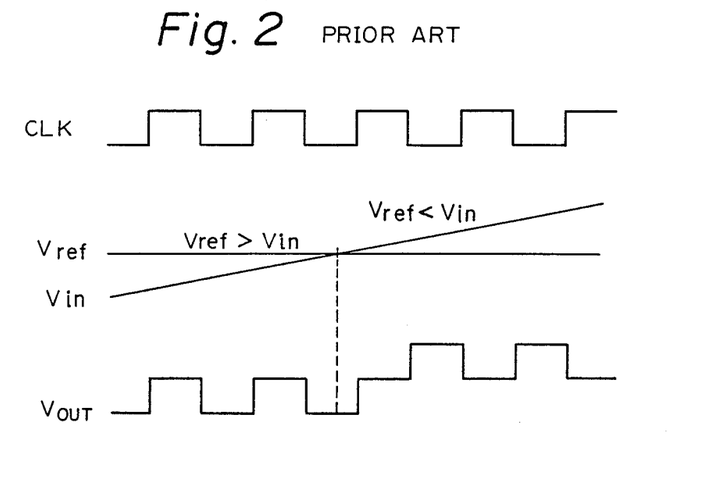
FIG. 2 is a diagram for explaining an operation of the comparator circuit shown in FIG. 1.

FIG. 2 is a diagram for explaining an operation of the comparator circuit shown in FIG. 1.

When the input signal $V_{in}$ applied to the differential amplifier 102 is higher than the reference signal $V_{ref}$, as clearly shown in FIG. 2, a latch operation is started and the output signal $V_{OUT}$ is changed from a lower output pulse to an upper output pulse in the conventional comparator circuit shown in FIG. 1. Therefore, the change of the output pulse can be produced by a small difference in level between the input signal $V_{in}$ and the reference signal $V_{ref}$.

In the conventional comparator circuit as described above, a problem arises in that the circuit configuration has a tendency to become complex, for example, the differential amplifier 102 is constructed from a plurality of transistors 123-124, etc. Furthermore, the clock signal CLK is necessary in the conventional comparator circuit to produce the change of the output pulse from a small difference in level between the input signal $V_{in}$ and the reference signal $V_{ref}$. Additionally, in the conventional comparator circuit, when the relationship of the signal level between the input signal $V_{in}$ and the reference signal $V_{ref}$ is inverted, the output pulse of the output signal $V_{OUT}$ is not changed until the next pulse signal of the clock signal CLK is output, and thus a problem arises in that the operation speed of the conventional comparator circuit is too slow.

Next, a description will be given of the principle of a resonant-tunneling transistor (RTT) having a resonant-tunneling barrier for injecting electrons. This resonant-tunneling transistor includes a resonant-tunneling hot-electron transistor (RHET) and a resonant-tunneling bipolar transistor (RBT), and has negative differential resistance characteristics and a high speed operation.

Figure 3A:
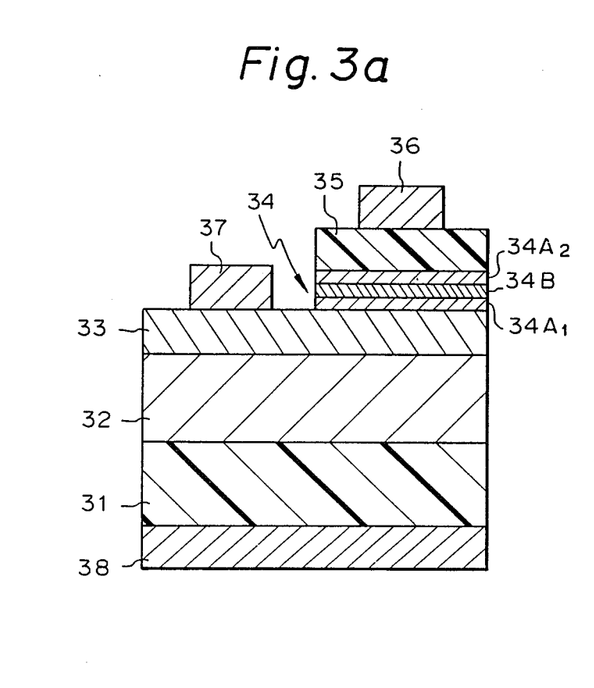
FIGS. 3a and 3b are views representing a structure and an energy state of a resonant-tunneling hot-electron transistor made of GaAs/AlGaAs.
Figure 3B:
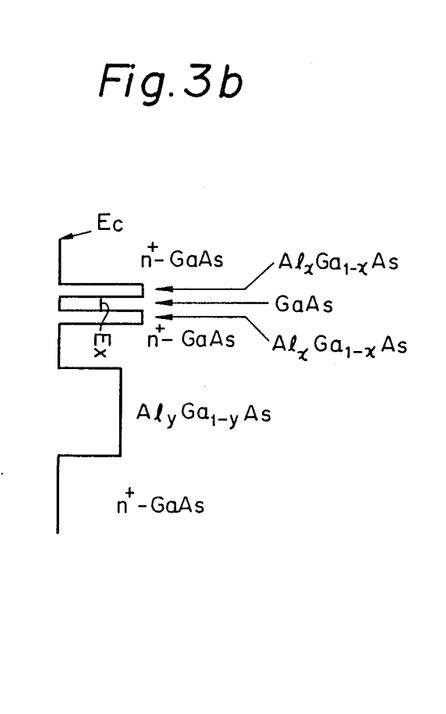

FIG. 3a is a sectional view of a semifinished RHET device made of GaAs/AlGaAs, and FIG. 3b is a graph of an energy band of the RHET device in FIG. 3a. In FIG. 3a, the resonant-tunneling transistor device consists of a collector electrode 38, an n+-type GaAs collector layer 31 formed on the collector electrode 38, a non-doped impurity $Al_yGa_{1-y}As$ (e.g., Y=0.3) collector side potential barrier layer 32 on the collector layer 31, an n+-type GaAs base layer 33 on the potential barrier layer 32, a superlattic layer 34, an n+-type GaAs emitter layer 35, an emitter electrode 36, and a base electrode 37. The superlattice layer 34 consists of an $Al_xGa_{1-x}As$ barrier layer 34A$_1$, a non-doped impurity GaAs quantum well layer 34B, and an $Al_xGa_{1-x}As$ barrier layer 34A$_2$. The superlattice layer 34 functions as an emitter side potential barrier. In this specification, the superlattice is defined such that at least one quantum well is provided therein. In FIG. 3a, a plurality of quantum wells may be formed.

In FIG. 3b, reference $E_c$ represents a bottom of a conduction-energy band, and $E_x$ an energy level of a sub-band at the quantum well.

Figures 4A, 4B, 4C:
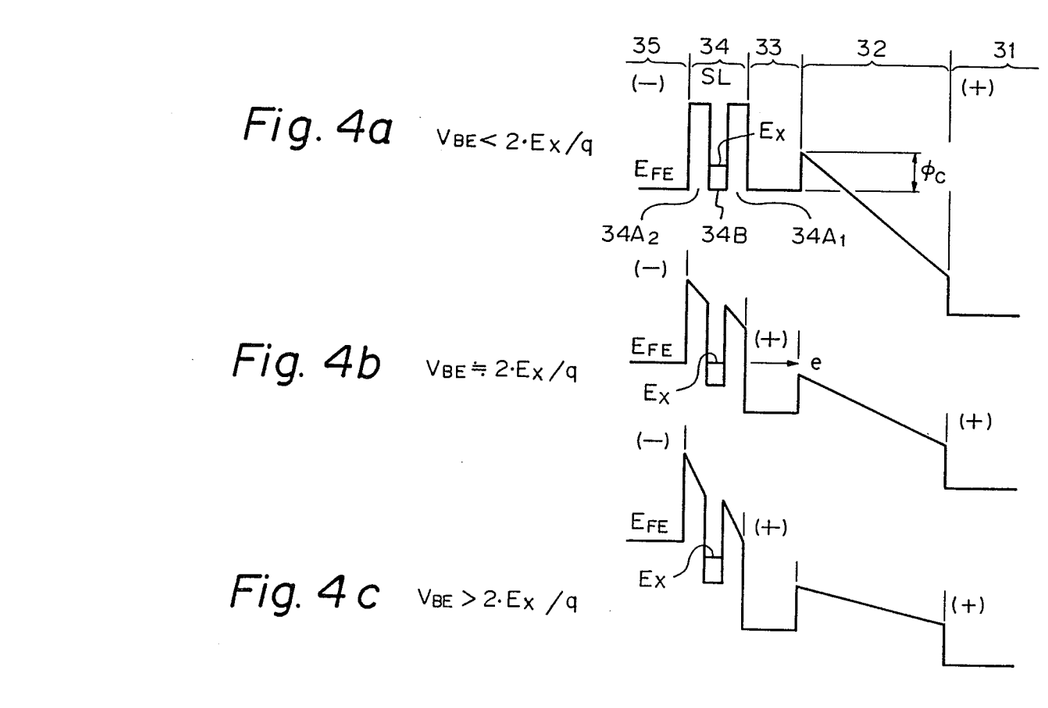

Referring to FIGS. 4a, 4b and 4c, the principle of the operation of the resonant-tunneling transistor device will be described.

FIG. 4a is a graph of an energy band of the RHET device shown in FIG. 3a where a voltage $V_{BE}$ between the base layer 33 and the emitter layer 35 is lower than $2 \cdot E_x/q$, or is too low, for example, approximately zero volts and wherein q represents a charge of carriers. In FIG. 4a, although a voltage $V_{CE}$ exists between the collector layer 31 and the emitter layer 35, electrons at the emitter layer 35 cannot reach the base layer 33 by tunneling through the superlattice layer 34, since the base-emitter voltage $V_{BE}$ is almost zero. Therefore, a level of an energy $E_{FE}$, namely a quasi-Fermi level $E_x$ is found at the sub-band. Accordingly, a current does not flow between the emitter layer 35 and the collector layer 31. Reference $\phi_c$ represents a conduction-band discontinuity.

FIG. 4b is a graph of an energy band of the RHET device, when the base-emitter voltage $V_{BE}$ is approximately equal to $2 \cdot E_x/q$. In FIG. 4b, the energy level $E_{FE}$ at the emitter layer 35 is substantially equal to the energy level $E_x$ of the sub-band at the quantum well layer 34B. As a result, due to a resonant-tunneling effect, electrons at the emitter layer 35 are passed through the superlattice layer 34 and injected in the base layer 33. The potential of the injected electrons, for example, 0.3 eV, is converted to kinetic energy, bringing the electrons to a "hot" state. The hot electrons are ballistically passed through the base layer 33 and reach the collector layer 31, and as a result, a current flows between the emitter layer 35 and the collector layer 31.

FIG. 4c is a graph of an energy band of the RHET device shown in FIG. 3a. Where the base-emitter voltage $V_{BE}$ is higher than $2 \cdot E_x/q$. In FIG. 4c, the energy level $E_{FE}$ at the emitter layer 35 is higher than the energy level $E_x$ of the sub-band at the quantum well layer 34B. The resonant tunneling effect does not occur, and the electrons are not introduced from the emitter layer 35 to the base layer 33. Consequently, the current flowing into the RHET device is reduced. On the other hand, by decreasing the barrier height of the barrier layer 34A, adjacent to the base layer 33 to a suitable value, the electrons may be directly tunneled through the barrier layer 34A$_2$ adjacent to the emitter layer 35, and as a result, a certain amount of collector current may flow.

Figure 3C:
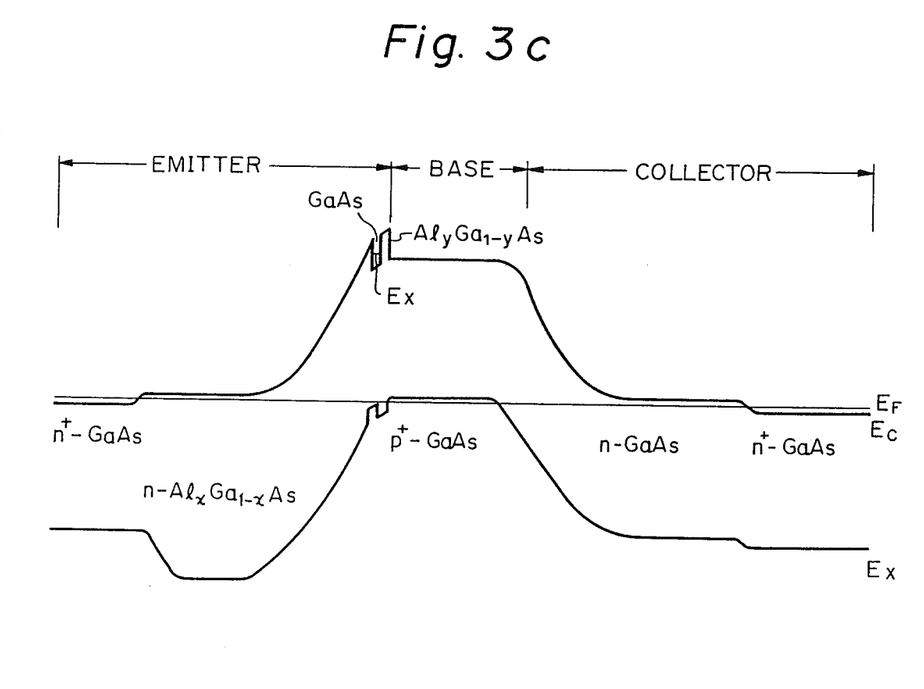
FIG. 3c is a view representing an energy state of a resonant-tunneling bipolar transistor made of GaAs/AlGaAs.

FIG. 3c is a graph representing an energy band of a resonant-tunneling bipolar transistor (RBT) made of GaAs/AlGaAs. The RBT consists of an emitter layer of N+-type GaAs, a base layer of p+-type GaAs, and a collector layer of n+-type GaAs. The emitter layer includes a superlattice having at least one quantum well with a sub-band energy $E_x$. The base layer and the collector layer are PN-joined.

The RBT also applies a resonant-tunneling effect and the principle of the operation thereof is similar to that of the RHET, and therefore, an explanation thereof is omitted.

Figure 5:
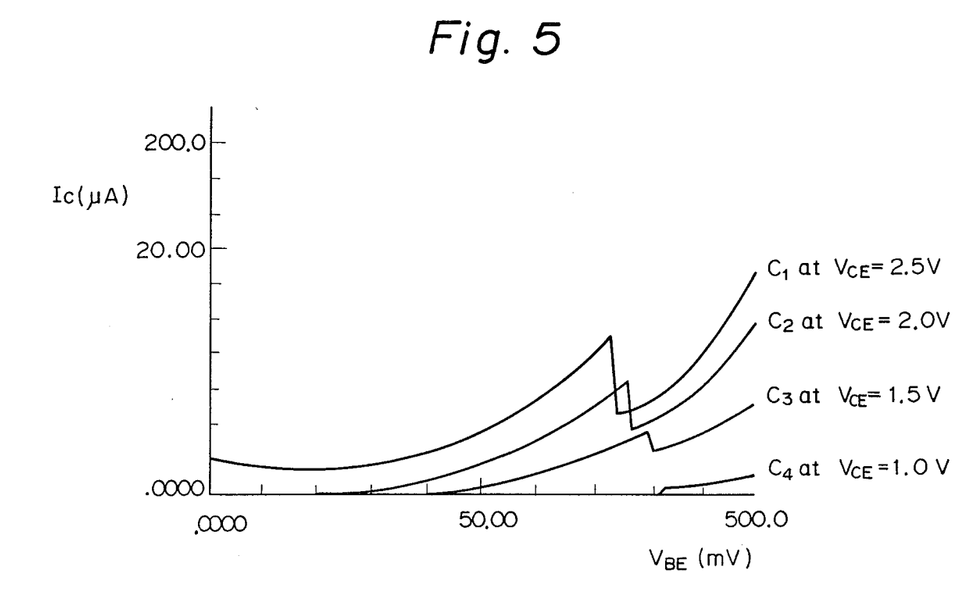

FIG. 5 is a graph illustrating the characteristics of the RHET device set forth above. In FIG. 5, the abscissa indicates the base-emitter voltage $V_{BE}$ and the ordinate indicates the collector current $I_c$. Curves $C_1$, $C_2$, $C_3$ and $C_4$ represent the characteristics when the collector-emitter voltage $V_{CE}$ are representatively 2.5 volts, 2.0 volts, 1.5 volts and 1.0 volt.

The curves indicate n-shaped differential negative-resistance characteristics. The present invention uses this feature to realize a comparator circuit.

Figure 6A:
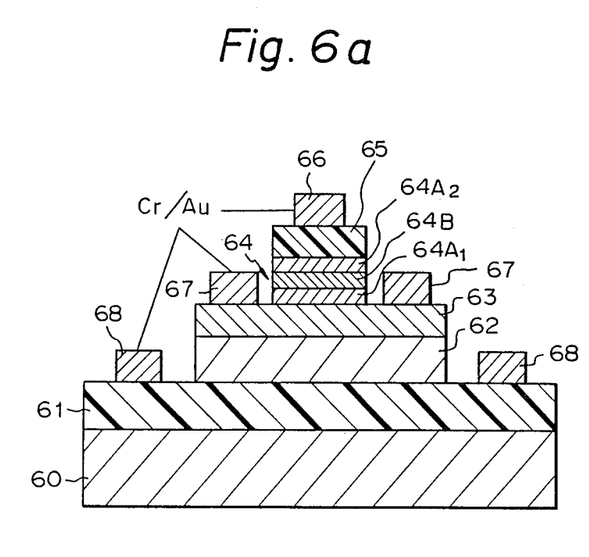
FIGS. 6a and 6b are views representing a structure and an energy state of a resonant-tunneling hot-electron transistor made of GaInAs/(AlGa)InAs.
Figure 6B:
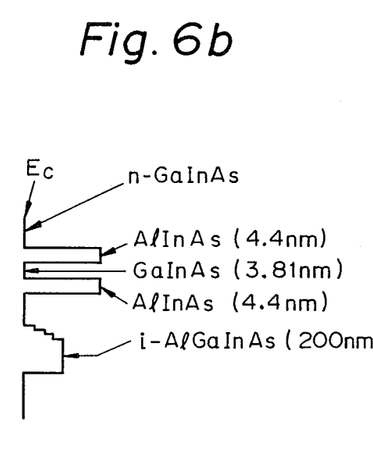

FIGS. 6a and 6b are views representing a structure and an energy state of a resonant-tunneling hot-electron transistor made of GaInAs/(AlGa)InAs. The GaInAs/(AlGa)InAs RHET has a preferable characteristic to that of the GaAs/AlGaAs RHET described above. In FIG. 6a, the resonant-tunneling transistor device consists of an InP substrate 60, an n-type GaInAs collector layer 61 formed on the substrate 60, an $(Al_{0.5}Ga_{0.5})_{0.48}In_{0.52}As$ collector barrier layer 62 formed on the collector layer 61, an n-type GaInAs base layer 63 formed on the collector barrier layer 62, a superlattice layer 64, an n-type GaInAs emitter layer 65, an emitter electrode 66, a base electrode 67, and a collector electrode 68. The superlattice layer 64 consists of a quantum well layer 64B and two barrier layers $64A_1$ and $64A_2$; the quantum well layer 64B being sandwiched between the two barrier layers $64A_1$ and $64A_2$. For example, the quantum well layer 64B acting as the hot electron injector is formed as a 3.81 nm $Ga_{0.47}In_{0.53}As$ layer, and the two barrier layers $64A_1$ and $64A_2$ are formed as 4.4 nm $Al_{0.47}In_{0.53}As$ layers respectively. Furthermore, the base layer 63 is 25 nm to 100 nm thick and has a carrier concentration of $1 \times 10^{18}$ cm$^{-3}$, and the collector barrier layer 62 is 200 nm thick with a 6 nm compositional graded stepwise layer to reduce quantum mechanical reflections. Note, the $\Gamma - L$ valley separation energy of the GaInAs/(AlGa)InAs RHET is higher than that of the GaAs/AlGaAs RHET (0.30 eV). That is, in this GaInAs/(AlGa)InAs RHET device, the $\Gamma - L$ valley separation energy of $Ga_{0.47}In_{0.53}As$ is about 0.55 eV and is high enough for practical use.

Now, preferred embodiments of the present invention will be described.

Figure 7:
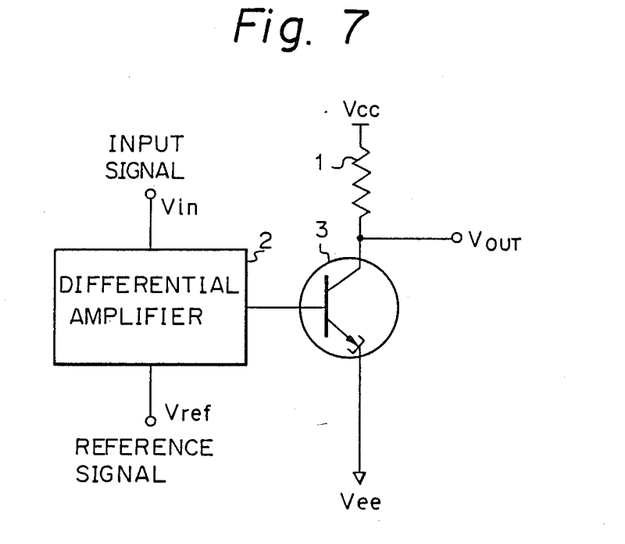
FIG. 7 is a basic circuit block diagram illustrating a comparator circuit according to the present invention.

FIG. 7 is a basic block diagram of a comparator circuit according to the present invention.

As shown in FIG. 7, a comparator circuit comprises a first power supply means $V_{cc}$, a second power supply means $V_{ee}$, a resistor 1, a differential amplifier 2, a resonant-tunneling transistor 3, and an output terminal $V_{OUT}$. The resistor 1 is connected to the first power supply means $V_{cc}$. The differential amplifier 2 is supplied with a reference signal $V_{ref}$ and an input signal $V_{in}$. The resonant-tunneling transistor 3 has a base, a collector, and an emitter. The base of the transistor 3 is operatively connected to the differential amplifier 2 for receiving an output signal of the differential amplifier 2; the collector of the transistor 3 is operatively connected to the first power supply means $V_{cc}$ via the resistor 1; and the emitter of the transistor 3 is operatively connected to the second power supply means $V_{ee}$. The output terminal $V_{OUT}$ is operatively connected to a connection portion between the collector of the transistor 3 and the resistor 1 for outputting an output signal of the comparator circuit.

Figure 8:
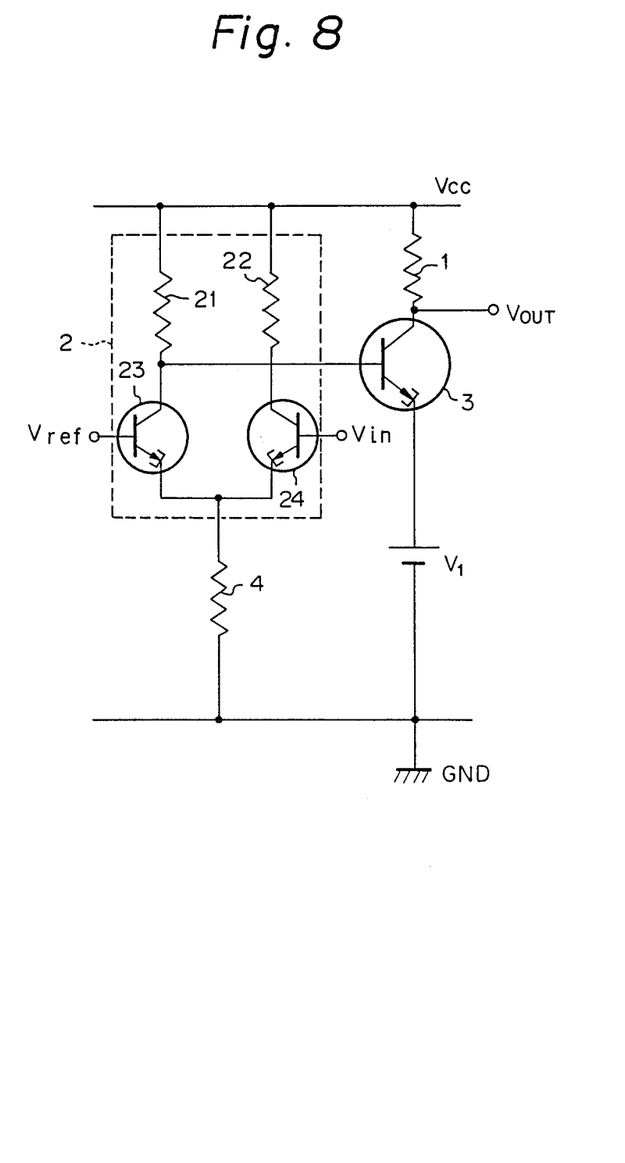
FIG. 8 is a circuit diagram illustrating one embodiment of a comparator circuit according to the present invention.
Figure 9:
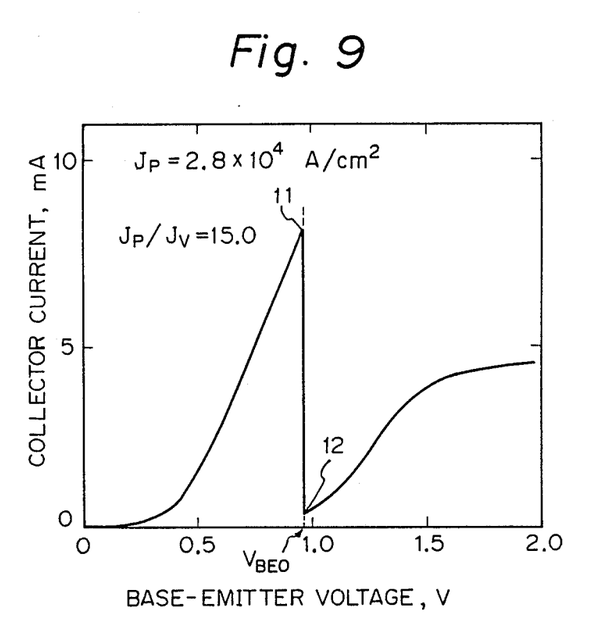
FIG. 9 is a graph illustrating a characteristic of a resonant-tunneling transistor used in a comparator circuit according to the present invention; and, FIG. 10 is a diagram for explaining an operation of the comparator circuit shown in FIG. 8.

FIG. 8 is a circuit diagram of one embodiment of a comparator circuit according to the present invention. As shown in FIG. 8, a comparator circuit of the present invention comprises a differential amplifier 2 and one resonant-tunneling transistor 3. This resonant-tunneling transistor (RTT) is, for example, an RHET or an RBT as described above. The characteristic of the resonant-tunneling transistor, for example, GaInAs/(AlGa)InAs RHET, is shown in FIG. 9. The resonant-tunneling transistor has a characteristic such that the collector current against a base-emitter voltage is increased, decreased, and again increased. The collector current exhibits a pronounced peak due to resonant-tunneling. For example, in the GaInAs/(AlGa)InAs RHET shown in FIG. 9, the peak collector current is $2.8 \times 10^4$ A/cm$^2$ and the peak-to-valley ratio reaches 15.0.

The differential amplifier 2 includes two resistors 21, 22 and two transistors 23, 24; the collectors of the transistor 22 and 23 are supplied with a high level power supply potential $V_{cc}$ via the resistors 21 and 22 respectively, and the emitters of the transistors 21 and 22 are commonly connected to one end of the resistor 4. Further, the base of the transistor 23 is supplied with a reference signal $V_{ref}$, and the base of the transistor 24 is supplied with an input signal $V_{in}$. In the above description, the other end of the resistor 4 is connected to a low level power supply (for example, a ground GND). Note, the resistors 1, 21, 22 and 4 are made of metal silicide or metal nitride by a sputtering method, to protect a heterostructure of the resonant-tunneling transistor 3. If these resistors 1, 21, 22 and 4 are made by an ion implanation method, the heterostructure of the transistor 3 is destroyed.

The output signal produced by the connection portion between the collector of the transistor 23 and the resistor 22 is applied to the base of the resonant-tunneling transistor 3. Note, the output signal level of the differential amplifier 2 is changed to a high level and a low level. Referring to FIG. 9, the high output signal level of the differential amplifier 2 is higher than the voltage of the valley 12, and the low output signal level of the differential amplifier 2 is lower than the voltage of the peak 11. Note, the voltage of the valley 12 is almost equal to the voltage of the peak 11, which is indicated as the reference $V_{BEO}$ of the characteristic curve of the transistor 3 shown in FIG. 9.

Referring to FIG. 8, the collector of the resonant-tunneling transistor 3 is supplied with the high level power supply potential $V_{cc}$ via a resistor 1, and the emitter of the transistor 3 is supplied with a potential higher by a potential level $V_1$ than the ground potential GND. An output signal $V_{OUT}$ is produced from the connection portion between the resistor 1 and the collector of the transistor 3.

As described above, the comparator circuit of the present invention can be simply formed by only a few elements, and the clock signal CLK is not needed. Furthermore, the response time of the comparator circuit can be further shortened by using RHET's, RBT's or HEMT's having a high speed operation ability as the transistors 23 and 24 of the differential amplifier 2. Note, it is, of course, understood that the transistors of the comparator circuit can be formed by the same type transistors, e.g., RBT's. In case where the transistors 23 and 24 are RHETs or RBTs, it should be noted that the base emitter voltage thereof should be limited to the voltage range lower than the voltage of the negative resistance.

Figure 10:
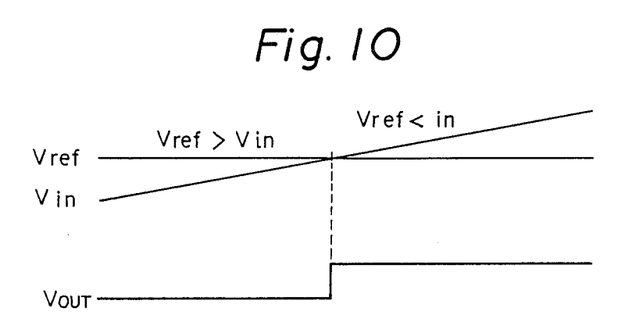

FIG. 10 is a diagram for explaining an operation of the comparator circuit shown in FIG. 8.

In the comparator circuit shown in FIG. 8, when the input signal $V_{in}$ applied to the differential amplifier 2 is lower than the reference signal $V_{ref}$, the transistor 23 of the differential amplifier 2 is switched ON and the collector of the transistor 23 is at the low level.

Next, the base of the resonant-tunneling transistor 3 becomes low level (that is, the base-emitter voltage is lower than the potential $V_{BE0}$) and the collector current flows, so that the output signal $V_{OUT}$ is at the low level.

Conversely, when the input signal $V_{in}$ applied to the differential amplifier 2 is higher than the reference signal $V_{ref}$, the transistor 23 of the differential amplifier 2 is switched OFF and the collector current of the transistor 23 does not flow, and therefore, the collector of the transistor 23 is at the high level, i.e., high level power supply potential $V_{cc}$. Next, the base of the resonant-tunneling transistor 3 is at the high level (that is, the base-emitter voltage is higher than the potential $V_{BE0}$) and the collector current does not flow. Consequently, the output signal $V_{OUT}$ is at the high level (the high level power supply potential $V_{cc}$). Note, when the input signal $V_{in}$ is higher than the reference signal $V_{ref}$, the output signal (the base-emitter voltage of the transistor 3) of the differential amplifier 2 is almost at the level of the valley 12 of the characteristic curve of the transistor 3 shown in FIG. 9.

In this way, in the comparator circuit of the present embodiment, when the level between the input signal $V_{in}$ and the reference signal $V_{ref}$ is changed, the output signal $V_{OUT}$ can be changed instantaneously. Further, the operation speed of the resonant-tunneling transistor 3 is very fast and the elements of the circuit very few, and therefore, the response time is very short.

In accordance with the present invention as described above, the comparator circuit comprises a differential amplifier supplied with a reference signal and an input signal, a resonant-tunneling transistor having a base supplied with an output signal of the differential amplifier, a collector connected to the first power supply means via the resistor, and an emitter connected to the second power supply means. Therefore, it is possible to simplify the circuit configuration of the comparator circuit and to improve an operation speed of the comparator circuit by outputting an output signal from a connection portion between the resistor and the collector of the transistor.

Many widely different embodiments of the present invention may be constructed without departing from the spirit and scope of the present invention, and it should be understood that the present invention is not limited to the specific embodiments described in this specification, except as defined in the appended claims.

What is claimed is:

1. A comparator circuit comprising:
    a first power supply means;
    a second power supply means;
    a resistor means connected to said first power supply means;
    a differential amplifier supplied with a reference signal and an input signal;
    a resonant-tunneling transistor having a base connected to said differential amplifier for receiving an output signal of said differential amplifier, a collector connected to said first power supply means via said resistor means, and an emitter connected to said second power supply means; and
    an output terminal connected to a connection portion between said collector of said resonant-tunneling transistor and said resistor means, for outputting an output signal of said comparator circuit.

2. A comparator circuit as claimed in claim 1, wherein said resonant-tunneling transistor comprises a resonant-tunneling hot-electron transistor.

3. A comparator circuit as claimed in claim 1, wherein said resonant-tunneling transistor comprises a resonant-tunneling bipolar transistor.

4. A comparator circuit as claimed in claim 1, wherein said resonant-tunneling transistor comprises a GaAs/AlGaAs heterostructure.

5. A comparator circuit as claimed in claim 1, wherein said resonant-tunneling transistor comprises a GaInAs/(AlGa)InAs heterostructure.

6. A comparator circuit as claimed in claim 1, wherein said differential amplifier comprises transistors which are the same type as said resonant-tunneling transistor.

7. A comparator circuit as claimed in claim 1, wherein said resistor means is made of metal silicide or metal nitride by a sputtering method.

8. A comparator circuit as claimed in claim 1, which is used as an analog-to-digital converter.

9. A comparator circuit as claimed in claim 1, wherein said resonant-tunneling transistor has a characteristic curve including a peak and a valley in the collector current against a base-emitter voltage, and said differential amplifier outputs a high level signal close to a voltage of said valley and a low level signal close to a voltage of said peak.

10. A comparator circuit as claimed in claim 9, wherein the voltage of said valley is almost equal to the voltage of said peak.

* * * * *